US012660310B2

(12) United States Patent
Wang et al.

(10) Patent No.: US 12,660,310 B2
(45) Date of Patent: Jun. 16, 2026

(54) SEMICONDUCTOR DEVICE HAVING HUMP IN A MEDIUM-VOLTAGE REGION AND METHOD FOR FABRICATING THE SAME

(71) Applicant: UNITED MICROELECTRONICS CORP., Hsin-Chu City (TW)

(72) Inventors: Chih-Yi Wang, Tainan City (TW);
Ya-Ting Hu, Kaohsiung City (TW);
Wei-Che Chen, Kaohsiung City (TW);
Chang-Yih Chen, Tainan City (TW);
Kun-Szu Tseng, Tainan City (TW);
Yao-Jhan Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 404 days.

(21) Appl. No.: 18/220,839

(22) Filed: Jul. 12, 2023

(65) Prior Publication Data

US 2024/0413017 A1 Dec. 12, 2024

(30) Foreign Application Priority Data

Jun. 12, 2023 (TW) ................................ 112121791

(51) Int. Cl.
H10D 84/85 (2025.01)
H10D 30/01 (2025.01)
(Continued)

(52) U.S. Cl.
CPC ......... H10D 84/856 (2025.01); H10D 30/021 (2025.01); H10D 62/113 (2025.01);
(Continued)

(58) Field of Classification Search
CPC .. H10D 30/01; H10D 30/021; H10D 30/0212; H10D 30/0213; H10D 30/0215; H10D 30/0217; H10D 30/0221; H10D 30/023; H10D 30/0243; H10D 30/025; H10D 30/026; H10D 30/027; H10D 30/0275; H10D 30/0277; H10D 30/0278; H10D 30/0413; H10D 62/113; H10D 84/01; H10D 84/0144; H10D 84/0147; H10D 84/0151; H10D 84/0158; H10D 84/02; H10D 84/032; H10D 84/035; H10D 84/038; H10D 84/07; H10D 84/08; H10D 84/83; H10D 84/8311; H10D 84/8312; H10D 84/83125; H10D 84/83135;
(Continued)

(56) References Cited

U.S. PATENT DOCUMENTS 8,513,131 B2 8/2013 Cai et al.
2023/0052880 A1* 2/2023 Izumi ................... H10D 84/859

* cited by examiner

*Primary Examiner* — Cheung Lee
(74) *Attorney, Agent, or Firm* — Winston Hsu

(57) ABSTRACT

A method for fabricating a semiconductor device includes the steps of providing a substrate having a medium-voltage (MV) region and a low-voltage (LV) region, forming fin-shaped structures on the LV region, forming an insulating layer between the fin-shaped structures, forming a hard mask on the LV region, and then performing a thermal oxidation process to form a gate dielectric layer on the MV region. Preferably, a hump is formed on the substrate surface of the MV region after the hard mask is removed, in which the hump further includes a first hump adjacent to one side of the substrate on the MV region and a second hump adjacent to another side of the substrate on the MV region.

9 Claims, 4 Drawing Sheets

(51) Int. Cl.
   *H10D 62/10*          (2025.01)
   *H10D 84/01*          (2025.01)
   *H10D 84/03*          (2025.01)
   *H10D 84/83*          (2025.01)
   *H10D 84/84*          (2025.01)

(52) U.S. Cl.
   CPC ....... *H10D 84/0144* (2025.01); *H10D 84/038*
         (2025.01); *H10D 84/8311* (2025.01); *H10D*
         *84/84* (2025.01)

(58) Field of Classification Search
   CPC ......... H10D 84/83138; H10D 84/8314; H10D
         84/8316; H10D 84/834; H10D 84/835;
         H10D 84/836; H10D 84/837–839; H10D
         84/84; H10D 84/85; H10D 84/853; H10D
               84/856; H10D 84/0128
   See application file for complete search history.

SEMICONDUCTOR DEVICE HAVING HUMP IN A MEDIUM-VOLTAGE REGION AND METHOD FOR FABRICATING THE SAME

BACKGROUND OF THE INVENTION

1. Field of the Invention

The invention relates to a method for fabricating semi-conductor device, and more particularly, to a method of using hard mask to protect fin-shaped structures on low-voltage (LV) region while a thermal treatment process is conducted on the medium-voltage (MV) region for forming gate dielectric layer.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes the steps of providing a substrate having a medium-voltage (MV) region and a low-voltage (LV) region, forming fin-shaped structures on the LV region, forming an insulating layer between the fin-shaped structures, forming a hard mask on the LV region, and then performing a thermal oxidation process to form a gate dielectric layer on the MV region. Preferably, a hump is formed on the substrate surface of the MV region after the hard mask is removed, in which the hump further includes a first hump adjacent to one side of the substrate on the MV region and a second hump adjacent to another side of the substrate on the MV region.

According to another aspect of the present invention, a semiconductor device includes a substrate having a medium-voltage (MV) region and a low-voltage (LV) region, a first hump on the substrate of the MV region, and a gate electrode on the first hump. Preferably, the hump includes a first ring-shape under a top view perspective.

According to yet another aspect of the present invention, a semiconductor device includes a substrate having a medium-voltage (MV) region and a low-voltage (LV) region, a first hump on one side of the substrate of the MV region, a second hump on another side of the substrate of the MV region, and a gate electrode on the first hump and the second hump.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
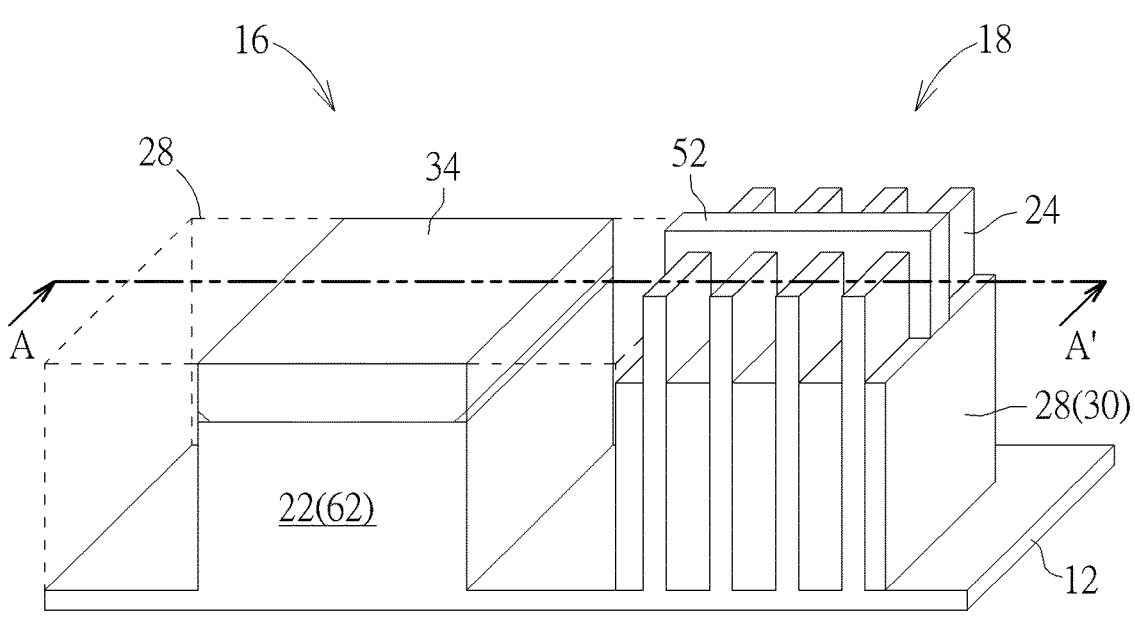
FIGS. 1-5 illustrate a method for fabricating a semiconductor device according to an embodiment of the present invention.
Figure 2:
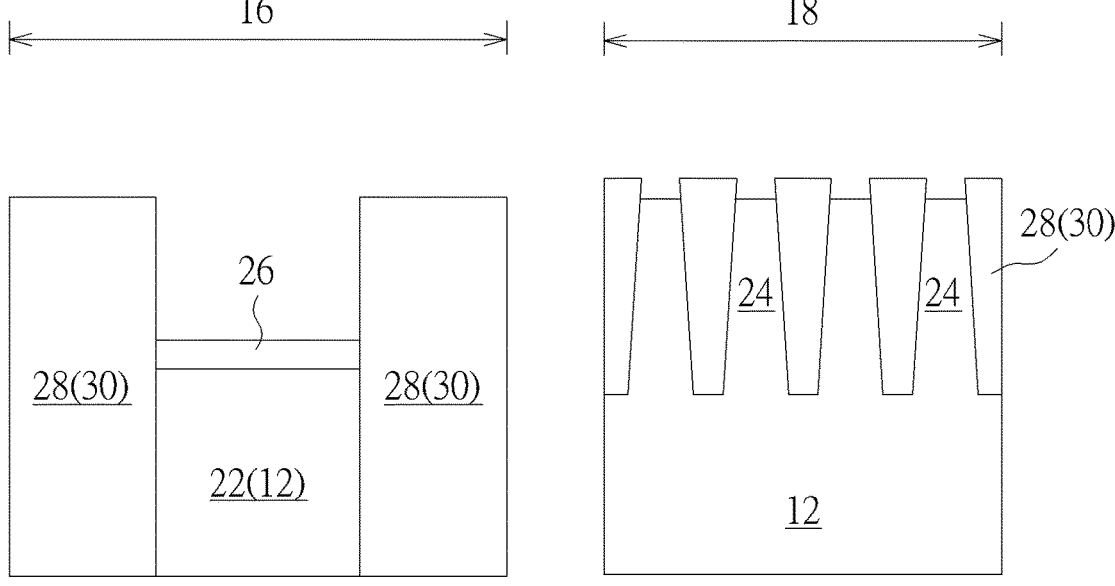

Referring to FIGS. 1-5, FIGS. 1-5 illustrate a method for fabricating a semiconductor device according to an embodiment of the present invention, in which FIG. 1 illustrates a 3-dimensional view for fabricating the semiconductor device according to an embodiment of the present invention and FIGS. 2-5 illustrate cross-section views for fabricating the semiconductor device along the sectional lines AA' of FIG. 1. As shown in FIGS. 1-2, a substrate 12 such as a silicon substrate or silicon-on-insulator (SOI) substrate is provided and two or more transistor regions including a medium-voltage (MV) region 16 and a low-voltage (LV) region 18 are defined on the substrate 12, in which a MV device is disposed on an active area 62 on the MV region 16, the LV region 18 could further include a core region and/or an input/output (I/O) region, and a LV device is disposed on the LV region 18. Preferably, left portions in FIGS. 2-5 are cross-section views illustrating a method for fabricating the semiconductor device on the MV region 16 and right portions in FIGS. 2-5 are cross-section views illustrating a method for fabricating the semiconductor device on the LV region 18.

In this embodiment, the regions 16, 18 could be transistor regions having same conductive type or different conductive types. For instance, each of the two regions 16, 18 could be a PMOS region or a NMOS region and the regions 16, 18 are defined to fabricate gate structures having different threshold voltages in the later process. Preferably, it would be desirable to first conduct an implantation process to form p-type deep wells on the MV region 16 and a n-type deep well on the LV region 18, but not limited thereto.

Next, a base 22 is formed on the MV region 16 and a plurality of fin-shaped structures 24 are formed on the substrate 12 of the LV region 18. Preferably, the fin-shaped structures 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the base 22 and the fin-shaped structures 24 could also be obtained by first forming a patterned mask (not shown) on the substrate, 12, and through an etching process, the pattern of the patterned mask is transferred to the substrate 12 to form the base 22 and the fin-shaped structures 24. Moreover, the formation of the base 22 and the fin-shaped structures 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the base 22 and fin-shaped structures 24. These approaches for forming the base 22 and fin-shaped structures 24 are all within the scope of the present invention.

In this embodiment, a pad layer 26 made of silicon oxide ($SiO_2$) and a pad layer (not shown) made of silicon nitride (SiN) could be formed on each of the base 22 and the fin-shaped structures 24 during the aforementioned patterning process. In this MV region 16, the pad layer 26 preferably covers the surface of the entire active area 62.

Next, as shown in FIG. 2, a flowable chemical vapor deposition (FCVD) process is conducted to form an insulating layer 28 made of silicon oxide on the base 22 and the fin-shaped structures 24 and filling the trenches between the base 22 and the fin-shaped structures 24, and a planarizing process such as chemical mechanical polishing (CMP) process is conducted to remove part of the insulating layer 28 for forming a shallow trench isolation (STI). Next, part of the pad layer made of silicon nitride could be removed to expose the pad layer 26 made of silicon oxide. It should be noted that to emphasize the fabrication conducted on the surface of the substrate 12 on the MV region 16 in the later process, only the pad layer 26 on the substrate 12 of the MV region 16 is shown while the pad layer 26 on the LV region 18 is omitted in the figures afterwards.

Figure 3:
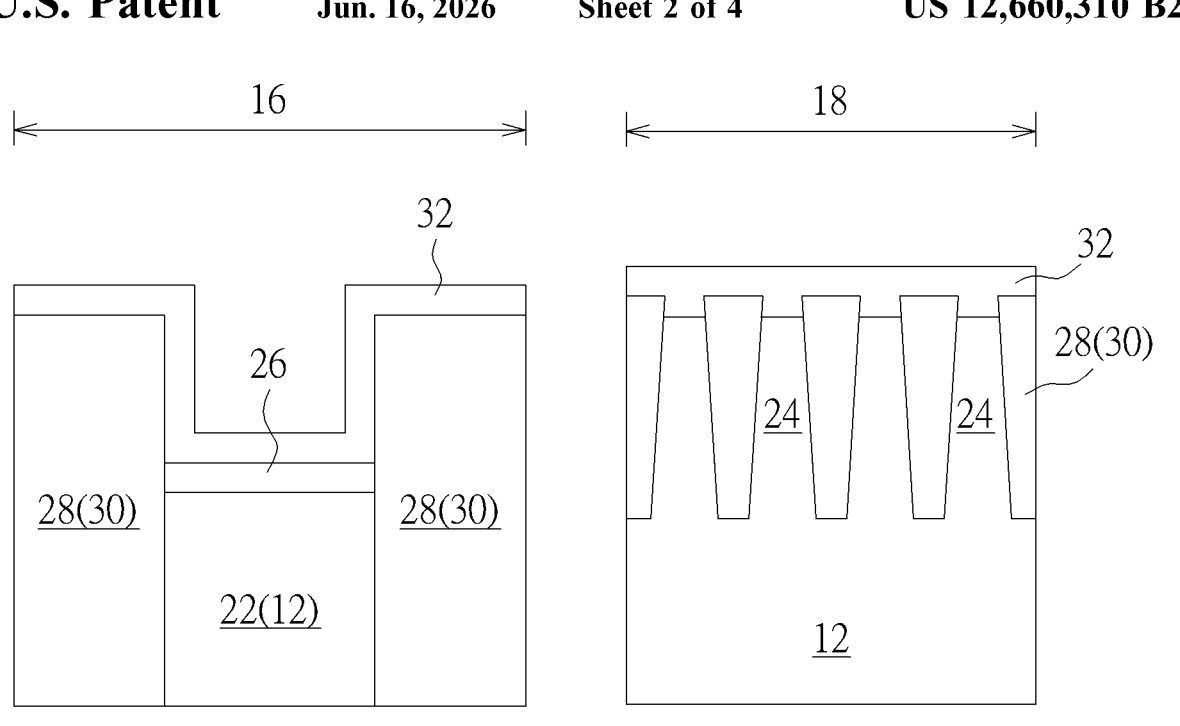

Next, as shown in FIG. 3, a hard mask 32 is formed on the MV region 16 and the LV region 18 to cover the pad layers 26 on both regions 16, 18. In this embodiment, the hard mask 32 preferably includes a dielectric material including but not limited to for example silicon oxide, silicon nitride, or silicon carbonitride (SiCN).

Figure 4:
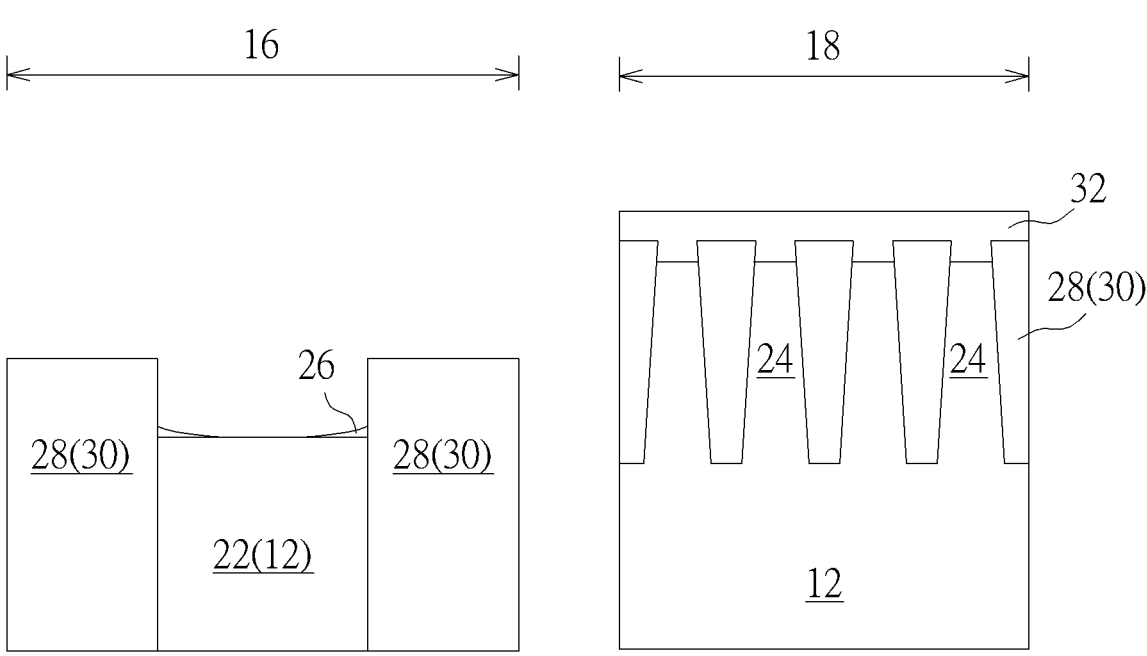

Next, as shown in FIG. 4, a photo-etching process is conducted by using a patterned mask (not shown) such as patterned resist as mask to remove the hard mask 32 and the pad layer 26 on the MV region 16 for exposing the surface of the substrate 12. It should be noted that the etching process conducted at this stage for removing the hard mask 32 made of SiN and the pad layer 26 made of $SiO_2$ on the MV region 16 preferably removes all of the hard mask 32 first and then removes most of the pad layer 26 afterwards. Specifically, after the hard mask 32 is removed completely, a small portion of the pad layer 26 is remained on two sides of the substrate in particular at corners contacted between the substrate 12 and the STI 30. Viewing from a cross-section perspective, the surface of the substrate 12 on the MV region 16 remains to be a planar surface while the top surface of the remaining pad layer 26 disposed at corners between the substrate 12 and the STI 30 could be an inclined planar surface or a curved surface. Viewing from a top view perspective, the remaining pad layer 26 at this stage preferably forms a ring disposed on the active area 62 of the substrate 12 on the MV region 16 and surrounding four corners of the active area 62.

Figure 5:
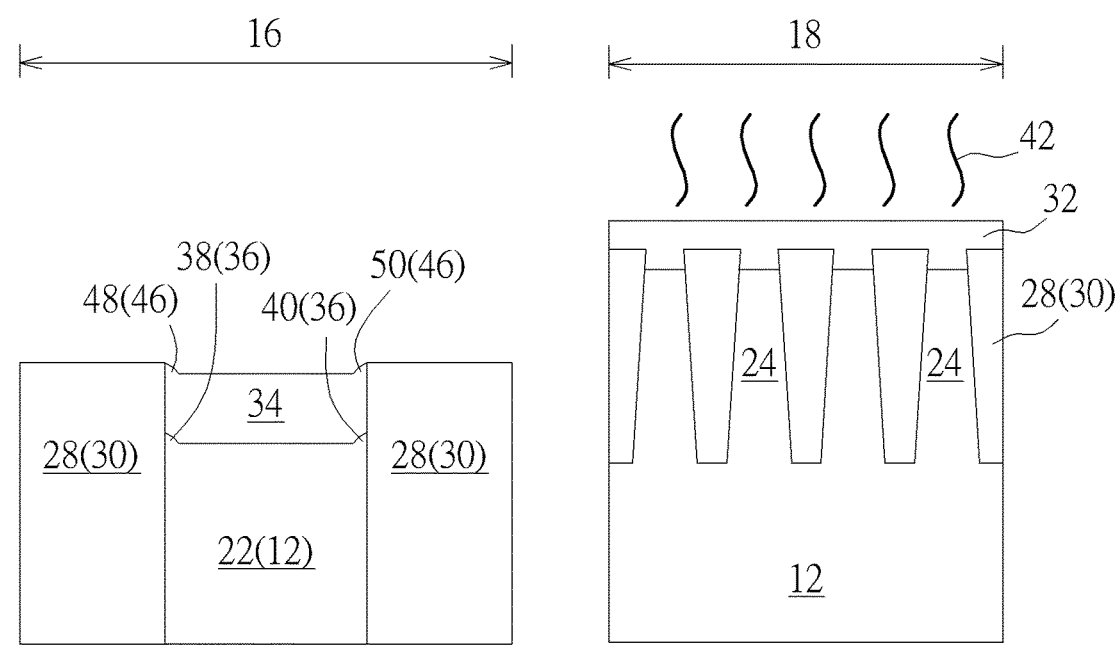

Next, as shown in FIG. 5, an oxide growth process or more specifically a rapid thermal oxidation (RTO) process 42 is conducted to form a gate dielectric layer 34 made of $SiO_2$ on the substrate 12 of MV region 16. It should be noted that since some pad layer 26 made of $SiO_2$ is remained on corners between the substrate 12 and the STI 30, the oxygen gas injected during the RTO process 42 at this stage preferably reacts with the substantially central portion of the substrate 12 surface or active area 62 surface to form the gate dielectric layer 34 made of $SiO_2$, and then gradually reacts with active area 62 outside the central portion and then finally reacts with edge portion of the active area 62 to form the gate dielectric layer 34.

Since the central portion of the substrate 12 on the MV region 16 is reacted first to form the gate dielectric layer 34 made of $SiO_2$ while peripheral or edge portion of the substrate 12 is reacted afterwards, the overall process of conducting the RTO process 42 for oxidizing the surface of the substrate 12 on MV region 16 preferably forms a hump 36 on the substrate 12 surface. Preferably, the hump 36 is formed by the elevated edge or peripheral portion of the substrate 12 hence the hump 36 and the substrate 12 are made of same material.

It should be noted that since the gate dielectric layer 34 is formed along with the hump 36 on the substrate 12 surface, the top surface of the gate dielectric layer 34 on two adjacent sides also forms another hump 46. Similarly, since the hump 46 is formed by the edge portion of the gate dielectric layer 34, the hump 46 and the gate dielectric layer 34 are made of same material.

Figure 6:
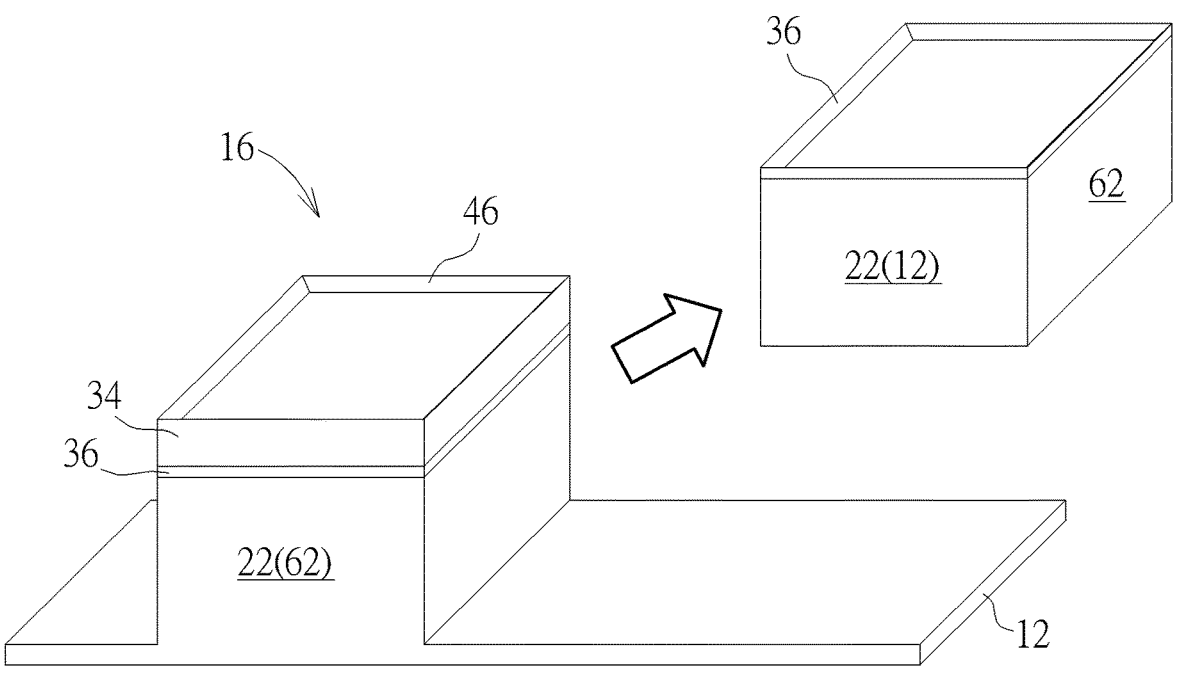
FIG. 6 illustrates a 3-dimensional view for forming the humps on the substrate surface and gate dielectric layer surface of MV region according to an embodiment of the present invention.

Referring to FIGS. 5-6, FIG. 5 illustrates a cross-section for forming humps 36, 46 on the substrate 12 surface and gate dielectric layer 34 surface of the MV region 16 according to an embodiment of the present invention and FIG. 6 illustrates a 3-dimensional view for forming the humps 36, 46 on the substrate 12 surface and gate dielectric layer 36 surface of MV region 16 according to an embodiment of the present invention. As shown on the left portion of FIG. 5, the hump 36 on the substrate 12 surface of the MV region 16 could further include a hump 38 adjacent to one side such as left side of the substrate 12 and another hump 40 adjacent to another side such as right side of the substrate 12, in which the top surface of each of the humps 38, 40 could be an inclined planar surface, a curved surface, an L-shape surface, or a V-shape surface, which are all within the scope of the present invention.

Similarly, the hump 46 on the surface of the gate dielectric layer 34 on MV region 16 could further include a hump 48 adjacent to one side such as left of the gate dielectric layer 34 and another hump 50 adjacent to another side such as right side of the gate structure layer 34, in which the top surface of each of the humps 48, 50 could be an inclined planar surface, a curved surface, an L-shape surface, or a V-shape surface, which are all within the scope of the present invention. From a top view perspective, the hump 36 on the active area 62 surface of the substrate 12 includes a ring shape that surrounds the four corners of the active area 62. Similarly, the hump 46 on the gate dielectric layer 34 surface also includes a ring that surrounds the four corners of the active area 62, in which the ring formed by the hump 46 on the gate dielectric layer 34 surface could completely overlap or partially overlap the ring formed by the hump 36 on the substrate 12 surface underneath. In other words, the area of the ring formed by the hump 46 on gate dielectric layer 34 surface could be greater than, equal to, or less than the area of the ring formed by the hump 36 on substrate 12 surface underneath, which are all within the scope of the present invention.

Figure 7:
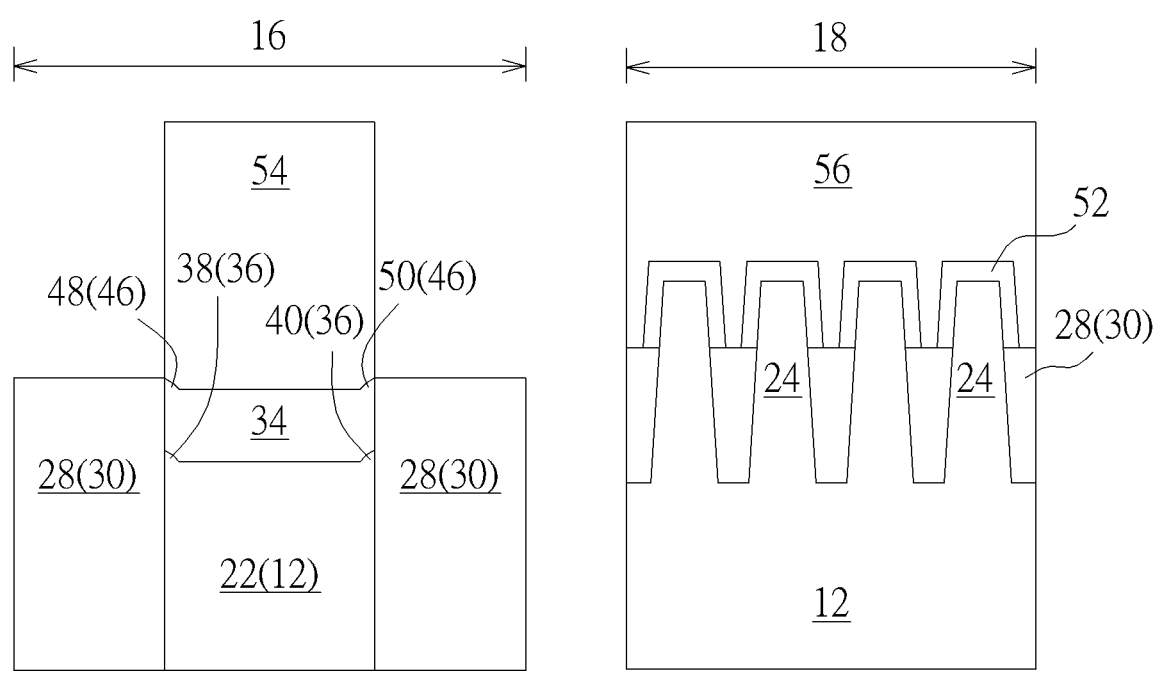
FIG. 7 illustrates a structural view for fabricating gate structures on the MV region and LV region after FIG. 6.
Figure 8:
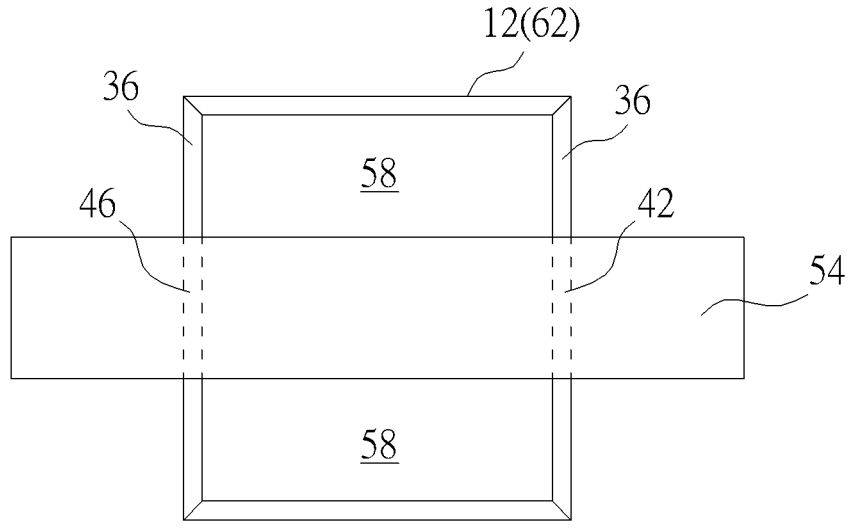
FIG. 8 illustrates a top view for fabricating a gate structure on the MV region according to an embodiment of the present invention.

Referring to FIGS. 7-8, FIG. 7 illustrates a structural view for fabricating gate structures on the MV region 16 and LV region 18 after FIG. 6 and FIG. 8 illustrates a top view for fabricating a gate structure on the MV region 16 according to an embodiment of the present invention. As shown in FIG. 7, it would be desirable to first remove the hard mask 32 and part of the STI 30 on the LV region 18 so that the top surface of the STI 30 is slightly lower than the top surface of the fin-shaped structure 24, and then conduct an oxidation process such as an in-situ steam generation (ISSG) process to form a gate dielectric layer 52 made of SiO₂ on the surface of the fin-shaped structures 24 on the LV region 18. Next, gate structures or gate electrodes 54, 56 could be formed on the base 22 and fin-shaped structures 24 on the MV region 16 and LV region 18 respectively, in which the formation of the gate electrodes 54, 56 could be accomplished by a gate first process, a high-k first approach from gate last process, or a high-k last approach from gate last process.

Next, a standard metal-oxide semiconductor (MOS) transistor fabrication process could be carried out by forming elements such as source/drain regions 58 in the substrate 12 adjacent to two sides of the gate electrodes 54, 56. Since the fabrication of a standard MOS transistor process is well known to those skilled in the art, the details of which are not explained herein for the sake of brevity. Viewing from a top view of FIG. 8, after the gate electrode 54 is formed on the MV region 16, the hump 36 on the substrate 12 would still surround the four corners of the active area 62. Nevertheless, the hump 46 on the gate dielectric layer 34 could also overlap the hump 36 on the substrate 12 surface entirely or as shown in FIG. 8 be patterned along with the gate electrode 54 so that the remaining hump 46 would only be disposed on edges of the active area 62 directly under the gate electrode 54, which are all within the scope of the present invention.

Overall, the present invention first forms a STI around the substrate on the MV region and fin-shaped structures on the LV region, forms a hard mask made of SiN on both MV region and LV region, removes the hard mask on the MV region, and then conducts a RTO process 42 to form a gate dielectric layer on the substrate surface of the MV region. Since the fin-shaped structures on the LV region is covered with hard mask 32 during the RTO process 42, the high temperature used during the RTO process 42 would not affect the density of the fin-shaped structures to result in fin width shrinkage and performance of the transistors would be preserved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a medium-voltage (MV) region and a low-voltage (LV) region;
   a first hump on the substrate of the MV region, wherein the first hump comprises a first ring-shape under a top view perspective and a top surface of the first hump is higher than a top surface of the substrate; and
   a gate electrode on the first hump.

2. The semiconductor device of claim 1, further comprising a gate dielectric layer between the substrate and the gate electrode, wherein the gate dielectric layer comprises a second hump.

3. The semiconductor device of claim 2, wherein the second hump comprises a second ring-shape under a top view perspective.

4. The semiconductor device of claim 3, wherein the second ring-shape overlaps the first ring-shape.

5. The semiconductor device of claim 1, wherein the first hump and the substrate are made of same material.

6. A semiconductor device, comprising:
   a substrate having a medium-voltage (MV) region and a low-voltage (LV) region;
   a first hump on one side of the substrate of the MV region, wherein a top surface of the first hump is higher than a top surface of the substrate;
   a second hump on another side of the substrate of the MV region; and
   a gate electrode on the first hump and the second hump.

7. The semiconductor device of claim 6, further comprising:
   a gate dielectric layer between the substrate and the gate electrode;
   a third hump on one side of the gate dielectric layer; and
   a fourth hump on another side of the gate dielectric layer.

8. The semiconductor device of claim 6, wherein the first hump and the substrate are made of same material.

9. The semiconductor device of claim 6, wherein the second hump and the substrate are made of same material.

* * * * *